United States Patent [19]

Schwartz et al.

[11] 4,425,549

[45] Jan. 10, 1984

[54] FIN LINE CIRCUIT FOR DETECTING R.F. WAVE SIGNALS

[75] Inventors: Paul M. Schwartz, Belleair Beach; James C. Chu, Tampa, both of Fla.

[73] Assignee: Sperry Corporation, New York, N.Y.

[21] Appl. No.: 286,813

[22] Filed: Jul. 27, 1981

[51] Int. Cl.³ .......................... H01P 3/12; H03D 1/10
[52] U.S. Cl. ................................. 329/161; 329/205 R; 329/206; 333/239; 333/247; 333/250
[58] Field of Search ........... 329/160, 161, 203, 205 R, 329/206; 455/281, 337; 333/239, 248, 250, 247, 118

[56] References Cited

U.S. PATENT DOCUMENTS 3,825,863  7/1974  Meier ................................. 329/161

Primary Examiner—Siegfried H. Grimm
Attorney, Agent, or Firm—Howard P. Terry

[57] ABSTRACT

A fin line apparatus, within a rectangular waveguide, for detecting R.F. signals utilizes metallic film conductors, disposed on both surfaces of a planar dielectric centered in the waveguide parallel to its sidewalls, for forming aligned channels, a first of which couples R.F. signals to a diode which provides rectified signals to a metallic film filter disposed in a gap in a conductor which opens into the first channel.

8 Claims, 6 Drawing Figures

FIN LINE CIRCUIT FOR DETECTING R.F. WAVE SIGNALS

BACKGROUND OF THE INVENTION

1. Field of the Invention

This invention pertains to the field of r.f. detectors and more particularly to r.f. detectors having a fin line construction that provides a high degree of isolation between an r.f. input signal and the resulting detected output signal.

2. Description of the Prior Art

In many applications, it is necessary to be able to provide a detected output signal corresponding to an r.f. input signal. For microwave transmissions in general, including those occurring at millimeter wave frequencies, such detection is often accomplished using a detector in microwave circuitry that combines waveguides and coaxial cables. Such combinations are generally costly, difficult to manufacture, and bulky in size. Furthermore, mating such systems to microwave integrated circuits, and printed transmission lines such as microstrip or strip line transmission lines is ordinarily difficult and expensive. On the other hand, printed transmission lines tend to be light in weight, less costly to produce than traditional coaxial and waveguide combinations, and have found increasing use where such characteristics are desirable. Printed transmission lines may however exhibit high loss at high frequencies, and do not permit simple transitions to conventional waveguides.

Fin line transmission lines generally comprise two or more separated conductors positioned on a dielectric substrate and housed within a waveguide. The separated conductors may be deposited on the dielectric substrate or manufactured from clad substrate using a conventional printed circuit techniques. The structure of the fin line type apparatus tends to concentrate the electromagnetic wave in the region of the separation between the conductors. Due to their unique construction, fin line transmission lines combine many of the desirable characteristics of printed transmission lines with those of conventional waveguides while avoiding many of the shortcomings of each.

The principal object of this invention is to provide an improved type of detector having the desirable characteristics of fin line transmission lines including production uniformity, reliability, reduced size, weight, and low cost, as well as excellent compatibility with microwave integrated circuits, printed transmission lines, conventional waveguides and other fin line devices.

SUMMARY OF THE INVENTION

According to the principles of the present invention, a fin line apparatus includes upper and lower metallic film conductors supported on each side of a thin dielectric substrate. The upper and lower conductors have a first separation between them and the corresponding conductors on each side of the substrate are substantially aligned with one another. The upper conductor on one of the sides contains a second separation into which a circuit structure, which may include a diode and a filter, is placed, such circuit structure also being adjacent to the first separation. The entire substrate is mounted within a hollow conductive waveguide. Electromagnetic waves incident to the first separation at a first plane, will propagate along the conductors to a second plane. An output signal, responsive to the electromagnetic waves incident to the second plane is provided by the circuit structure in the second separation. The output signal provided by a circuit structure comprising a diode and filter will be the detected output signal corresponding to the input r.f. electromagnetic wave.

DESCRIPTION OF THE PREFERRED EMBODIMENTS

Figure 1:
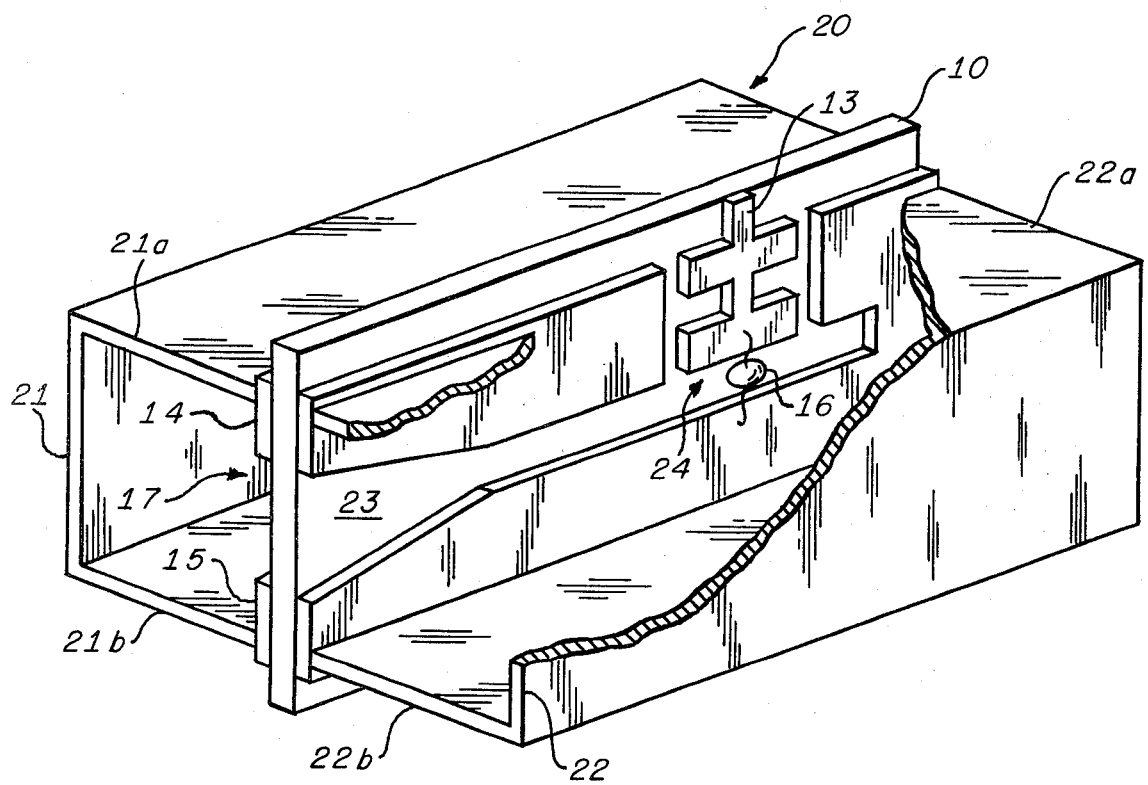
FIG. 1 is a perspective view of an embodiment of the invention showing the relative location of the waveguide dielectric substrate, film conductors, filter structure and discrete components.
Figure 2:
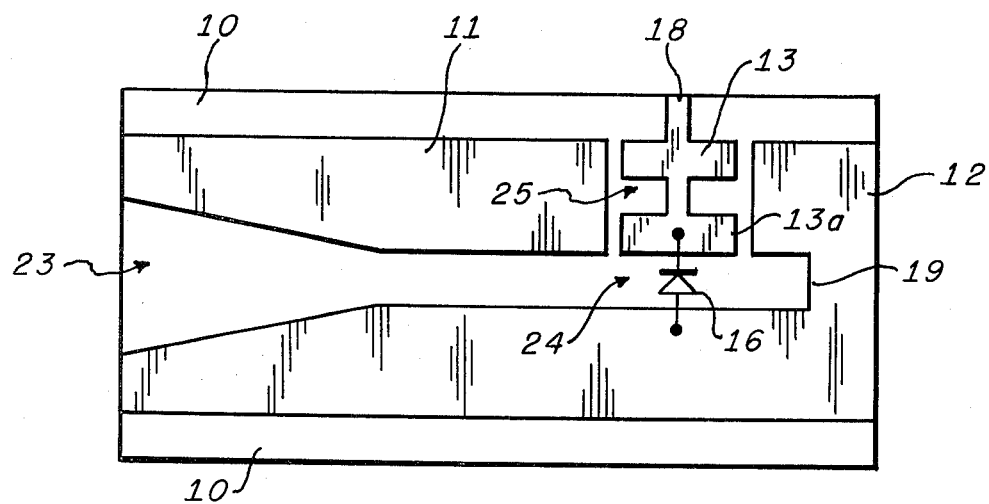
FIG. 2 is a front view of the dielectric substrate and associated structures of an embodiment of the invention.
Figure 5:
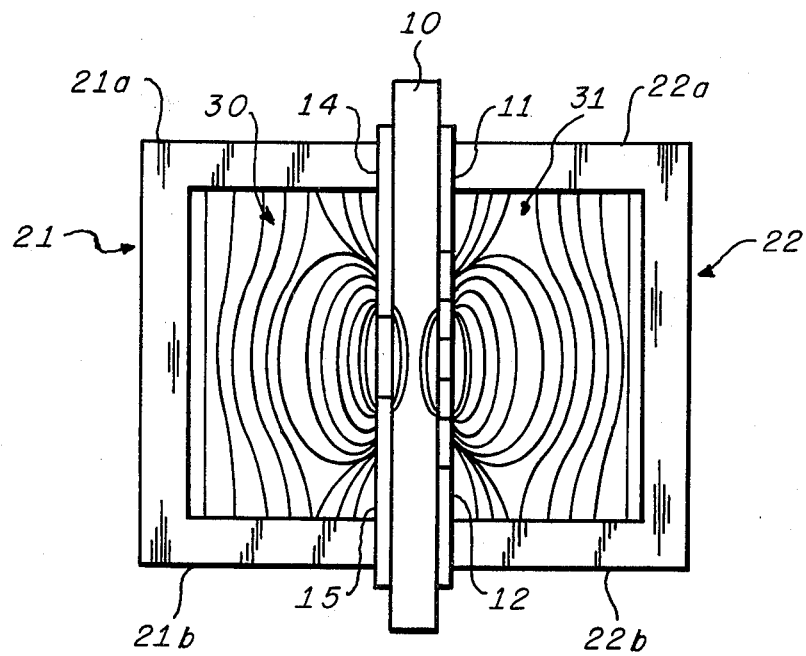
FIG. 5 is an end view of the invention.

Referring to FIG. 1 and FIG. 2, a fin line detector includes substrate 10 clad with metallic film conductors 11 and 12 and filter 13 on a first side of the substrate and metallic film conductor 17 that includes regions 14 and 15 on the opposite side parallel to and in substantial alignment with metallic film conductors 11 and 12, respectively. A discrete circuit element such as diode 16 poled in either direction may be coupled between filter element 13 and metallic film conductor 12. Filter 13 preferably includes selected regions of metallic film conductor that form filter elements. Separation 23 having a larger value at a first plane in the waveguide than at the region 24 in the vicinity of filter structure 13 and diode 16, is normally symmetrical about a longitudinal axis of substrate 10. Waveguide 20 is comprised of waveguide halves 21 and 22 which include substantially parallel walls 21a, 21b, and 22a, 22b, respectively, as shown in FIG. 5. Substrate 10, together with the various metal film conductors attached thereto is disposed substantially perpendicular to walls 21a, 21b, 22a, and 22b, between waveguide halves 21 and 22 such that metallic film conductors 11 and 12 are in d.c. contact with waveguide half 22 and regions 14 and 15 of metallic film conductor 17 are in d.c. contact with waveguide half 21. Metallic film conductors 11 and 12, and regions 14 and 15 of metallic film conductor 17 may extend past the exterior edges of walls 21a, 21b, 22a and 22b to ensure optimal r.f. contact. In the preferred embodiment, filter 13 is d.c. isolated from waveguide half 22 by removing a portion of wall 22a where it would ordinarily contact filter 13. Alternatively, an appropriate insulator may be placed between filter 13 and the walls 22a.

FIG. 2 which, shows a front view of substrate 10 and the structures thereon, may be considered a microstrip implementation of the invention. Metallic film conductors 11 and 12, as well as filter 13 are preferably formed from a metallic film having a thickness that is a fractional part of the wavelength of electromagnetic waves being propagated in the fin line detector. During fabrication metallic film conductors 11 and 12 and filter 13 may be etched from a metal clad dielectric substrate according to techniques well known in the art. The rear portion of gap 24, behaves as a back short 19 which will short r.f. energy appearing across separation 23. The distance from diode 16 to back short 19 may be used to tune the fin line detector according to methods well known in the art. Alternatively, separation 23 may be extended to the edge of substrate 10 such that back short 19 is removed entirely. In such a case, it may be desirable to couple an r.f. short exterior to the resulting fin line detector to provide the r.f. shorting function.

Figure 3:
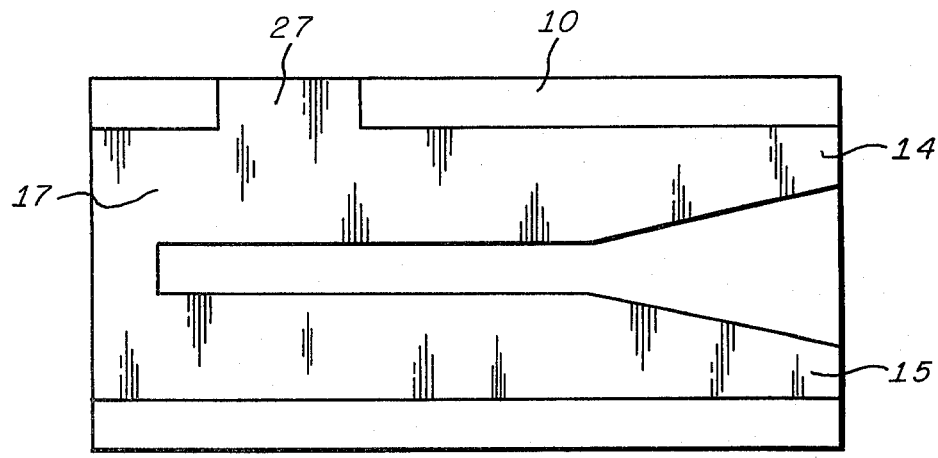
FIG. 3 is a rear view of the dielectric substrate and the associated structures thereon.

FIG. 3 shows a back view of the fin line substrate. Regions 14 and 15 of metallic film conductor 17, unlike metallic film conductors 11 and 12 of FIG. 2 do not have separation 25 between them, and are, in fact, electrically coupled. Regions 14 and 15 are substantially aligned with metallic film conductors 11 and 12 (FIG. 2), being separated therefrom by substrate 10. Region 14 includes an additional area of metallized conductor 27 which is aligned with filter structure 13, for reasons which will be described below.

Figure 4:
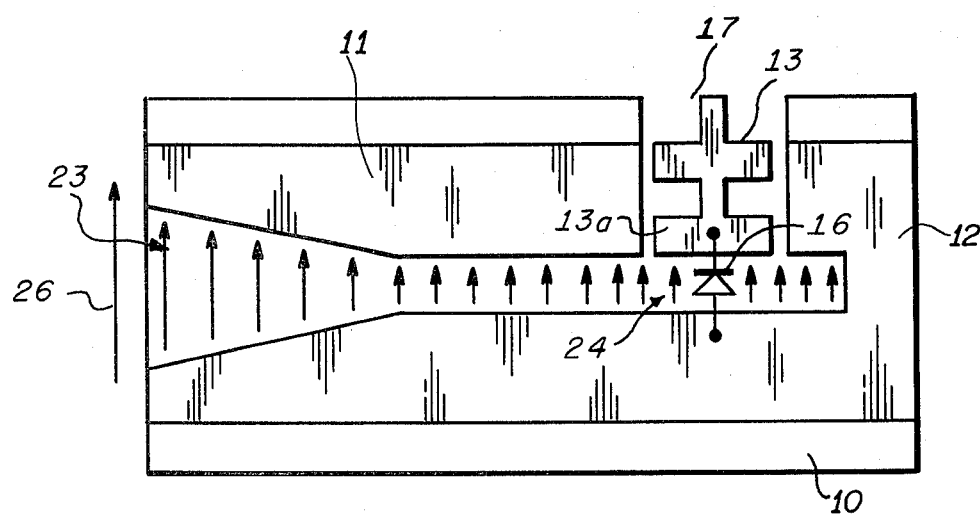
FIG. 4 is a front view of the dielectric substrate showing the electric field lines therein.

Referring now to FIG. 4, wherein the fin line structure of FIG. 2 is shown, an r.f. electromagnetic wave having an electric field oriented perpendicular to the longitudinal axis of the fin line structure at separation 23 and propagates along metallic film conductors 11 and 12, being concentrated thereby so as to provide for a more effective coupling of r.f energy to diode 16 and filter 13.

Refer now to FIG. 5 wherein an end view of the fin line detector is shown. The distribution of the electric field lines in waveguide halves 21 and 22 is shown by electric field lines 30 and 31, respectively. The fin line structure will behave as a transmission line, in the manner well known in the art. Area 27 of FIG. 3, is metallized to permit filter 13 of FIG. 2 to also behave as a transmission line, thus providing an output signal at terminal 18 of FIG. 2. Substrate 10 is preferably thin, thus causing the greatest proportion of the electric field to be concentrated in the low loss air medium filling the waveguide. The gap 24 of FIG. 2 between the film conductors is made small to concentrate the fields in this region away from the walls of the waveguide. In this manner, a large portion of the r.f. electromagnetic wave energy will be coupled across diode 16 and filter 13 of FIG. 2.

In operation, the r.f. electromagnetic waves will propagate between the conductors, and be detected by diode 16. Filter 13 forms a low impedance, low pass filter which provides the detected and filtered signal at terminal 18. The shape and dimensions of filter 13 are selected to provide the necessary frequency and impedance characteristics using techniques well known in the microwave circuitry art. For example, the large portion of the filter indicated as 13a in FIG. 4, serves to provide a nearly constant low r.f. impedance.

Placement of the filter 13 and diode 16 directly adjacent to gap 24 provides a wide bandwidth and further lowers the impedance, by eliminating distributed inductances that would otherwise result from disposing filter 13 remotely from gap 24. As a result, r.f. energy propagating across separation 23 to the rear in region 24 will not be prevented from reaching diode 16 by discontinuities presented by filter 13. The low frequency impedance of the filter can be kept at a constant resistance over a broad band thus allowing efficient coupling of the detected output to an amplifier having narrow pulse response. The invention thus provides a compact means of presenting a low impedance to the r.f. energy at the diode 16 attachment points while maintaining a low loss, low parasitic, wideband signal path for the detected signal.

Figure 6:
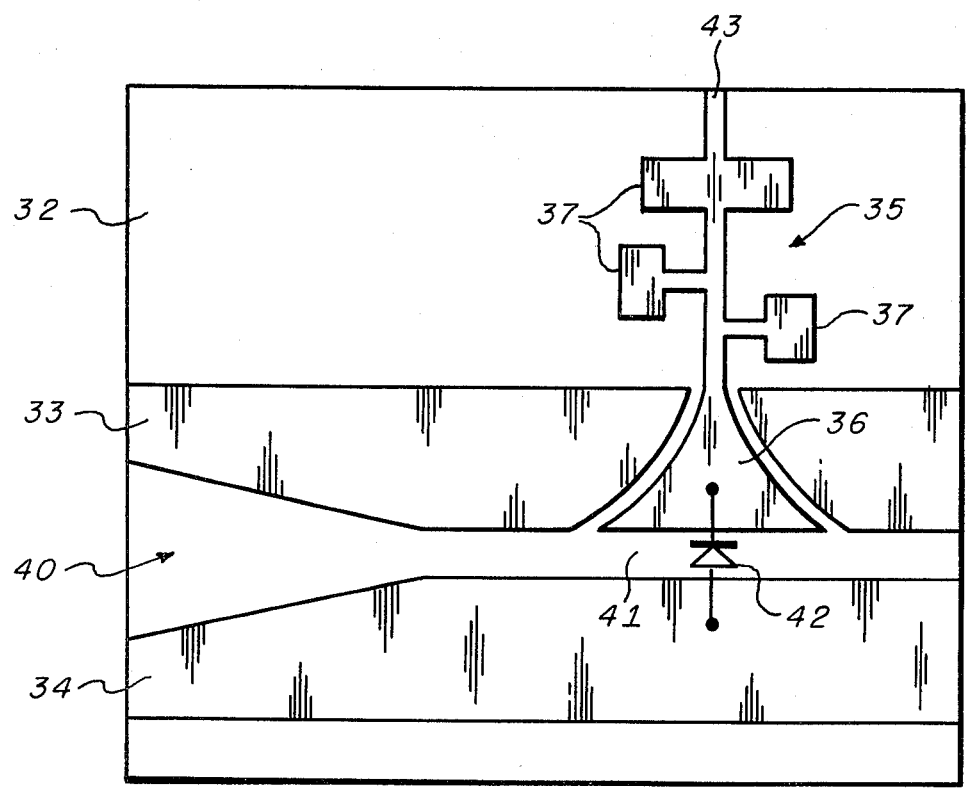
FIG. 6 is a front view of the dielectric substrate and associated structures of a second embodiment of the invention.

FIG. 6 shows a side view of a coplanar waveguide embodiment of the invention. Substrate 32 is clad on a first side with metallic film conductors 33 and 34, and filter structure 35 which are also formed from a metallic film having a thickness that is a fractional part of the electromagnetic waves wavelength. Filter structure 35, like filter structure 13 of FIG. 2 is disposed in a separation between metallic film conductors 33 and 34. Filter structure 35 includes impedance transformer 36 and filter elements 37. Filter elements 37 are not located directly adjacent to the gap between metallic film conductors 33 and 34, but are removed therefrom. Metallic film conductors 33 and 34 are separated by a separation 40 which narrows symmetrically about a longitudinal axis to region 41 in the vicinity of impedance transformer 36 and diode 42. Metallic film conductor 17 having regions 14, 15 and 27 (FIG. 3) is disposed on the second side of substrate 32 opposite to and in substantial alignment with metallic film conductors 33, 34 and filter structure 35. Diode 42 is located across gap 41, and connected to impedance transformer 36 and metallic film conductor 34, and may be poled in either direction.

Substrate 32 is disposed between waveguide halves 21 and 22, so that it is substantially perpendicular to walls 21a, 21b, 22a and 22b, and such that metallic film conductors 33 and 34, and regions 14 and 15 of metallic film conductor 17 are in electrical contact with walls 22a, 22b, 21a and 22b, respectively.

Operation of the invention using the embodiment shown in FIG. 6 is substantially the same as that described previously for the embodiment of FIGS. 1 and 2. R.F. electromagnetic waves incident to separation 40, propagate between metallic film conductors 33 and 34, to region 41, where the electromagnetic waves are detected by diode detector 42, and coupled to filter 35 via impedance transformer 36. Impedance transformer 36 functions to match the low impedance of the gap 41 to the high impedance of filter elements 37, thereby providing more efficient coupling of the r.f energy incident to separation 40 to diode 42 and filter 35. Impedance transformer 36 and filter elements 37 may be constructed according to principles well known in the art to provide the desired frequency and impedance characteristics. As previously described for the embodiment of FIGS. 1 and 2, the metallization in the area of 27, FIG. 3 is included to insure transmission line behavior for filter 35. The detected r.f. signal may be obtained from terminal 43. The embodiment of FIG. 6 has the same advantages that are possessed by the invention as embodied in FIGS. 1 and 2, including providing a low loss, low parasitic, wideband signal path for the detected signal.

While the invention has been described in its preferred embodiments, it is to be understood that the words which have been used are words of description rather than limitation and that changes may be made within the purview of the appended claims without departing from the true scope and spirit of the invention in its broader aspects.

We claim:

1. A fin line apparatus within a waveguide having substantially parallel top and bottom walls, and two substantially parallel sidewalls substantially perpendicular to said top and bottom walls, for supporting propagation therein of electromagnetic waves having a predetermined wavelength and for providing signals responsive to said electromagnetic waves, comprising:

a dielectric material, disposed in a plane between and substantially parallel to said two sidewalls of said waveguide;

a first metallic film conductor having a thickness that is a fraction of said wavelength, disposed substantially parallel to said sidewalls on a first planar surface of said dielectric material so that the area of said first planar surface not covered by said first metallic film conductor comprises a first region having a longitudinal axis substantially parallel to a longitudinal axis of said waveguide, said first region having a first end, and a second end having a flare, said area further comprising a second region having a first end opening into said first region between said flare and said first end of said first region, and having a second end disposed proximate the plane in which said top wall of said waveguide is disposed;

a second metallic film conductor, disposed substantially parallel to said sidewalls on a second planar surface of said dielectric material opposite said first metallic film conductor, in substantial alignment with said first metallic film conductor and said second region; and means, disposed substantially in said second region, for receiving electromagnetic waves from said first region and for providing output signals therefrom.

2. An apparatus as in claim 1 further comprising means, coupled between said receiving means and said first metallic film conductor below said first region, for detecting said electromagnetic waves and providing a detected output signal therefrom.

3. An apparatus as in claim 2 wherein said receiving means comprises means, having filter elements, for filtering said detected output signal.

4. An apparatus as in claim 3 wherein said detecting means comprises a diode.

5. An apparatus as in claim 4 wherein said filtering means comprises means for matching the impedance of said first region to the impedance of said filter elements.

6. An apparatus as in claim 4 wherein said first end of said first region is bordered by said first metallic film conductor at a predetermined distance from said detecting means.

7. An apparatus as in claim 3 wherein said first end of said first region is bordered by said first metallic film conductor at a predetermined distance from said detecting means.

8. An apparatus as in claim 1 wherein said dielectric material is substantially centered in said waveguide.

* * * * *